United States Patent [19]

Anderson

[11] Patent Number: 4,910,158
[45] Date of Patent: Mar. 20, 1990

[54] ZENER DIODE EMULATION AND METHOD OF FORMING THE SAME

[75] Inventor: Carl L. Anderson, Thousand Oaks, Calif.

[73] Assignee: Hughes Aircraft Company, Los Angeles, Calif.

[21] Appl. No.: 124,231

[22] Filed: Nov. 23, 1987

[51] Int. Cl.$^4$ .................. H01L 21/265; H01L 29/90
[52] U.S. Cl. ........................................ 437/22; 437/26; 357/13
[58] Field of Search ..................... 437/22, 26, 27; 148/DIG. 174, DIG. 84; 357/13

[56] References Cited

U.S. PATENT DOCUMENTS

| | | | |
|---|---|---|---|
| 3,655,457 | 4/1972 | Duffy | 437/26 |
| 4,104,085 | 8/1978 | Zandveld | 437/27 |
| 4,155,777 | 5/1979 | Dunkley | 357/13 |
| 4,651,178 | 3/1987 | Avery | 357/13 |
| 4,683,483 | 7/1987 | Burnham | 357/13 |

OTHER PUBLICATIONS

Ghandi, S. K.; *VLSI Fabrication Principles*, John Wiley and Sons, 1983, p. 300.
Pat. Abst. of Japan, Vol. 6, No. 170 (E-128) (1048), 9/3/82, & JP, A, 5785266 (Tokyo Shibaura Denki K.K.), 5/2/82.
Pat. Abst. of Japan, Vol. 12, No. 177 (E-613) (3024), 5/25/88 & JP, A, 62283672 (NEC Corp.), 12/9/87.
Pat. Abst. of Japan, Vol. 12, No. 65 (E-586) (2912), 2/27/88 & JP, A, 62209868 (Rohm Co. Ltd.), 9/16/87.
Pat. Abst. of Japan, Vol. 9, No. 258 (E-350) (1981), 10/16/85 & JP, A, 60106178 (Toshiba K.K.) 6/11/85.
Pat. Abst. of Japan, Vol. 11, No. 329 (E-552) (2776), 10/27/87 & JP, A, 62117369 (Fujitsu Ltd.), 5/28/87.

*Primary Examiner*—Olik Chaudhuri
*Attorney, Agent, or Firm*—P. M. Coble; W. K. Denson-Low

[57] ABSTRACT

An integrated circuit structure which emulates the reverse bias breakdown characteristic of a Zener diode is disclosed. It is particularly suited for gallium arsenide MESFET fabrication, for which satisfactory Zener-type devices are not otherwise available. Back-to-back buried diodes are formed by implanting a buried layer of one polarity doping into a semi-insulating substrate, and further implanting a pair of spaced contact regions of opposite polarity but higher doping levels from the buried layer to the substrate surface. The diode action takes place at the junctions of the contact regions and the buried layer. The device is symmetrical in operation, exhibiting a sharp breakdown at a defined voltage threshold. Specific implant energies and concentrations for a buried layer doped with Be$^+$ ions and contact regions doped with Si$^+$ ions are described. In an alternate embodiment, only one contact region is of opposite polarity to the buried layer, resulting in only one buried diode.

4 Claims, 2 Drawing Sheets

ZENER DIODE EMULATION AND METHOD OF FORMING THE SAME

BACKGROUND OF THE INVENTION

1. Field of the Invention

This invention relates to semiconductor devices, and more particularly to Zener diodes and to metal-semiconductor field effect transistor (MESFET) integrated circuit fabrication techniques on gallium arsenide substrates.

2. Description of the Related Art

A Zener diode is a two-terminal semiconductor junction device with a very sharp voltage breakdown in the reverse-bias region. They have been used most frequently in voltage regulator circuits to provide a voltage reference. Whereas most semiconductor diode applications make use of the pn-junction rectification characteristics for the functions of rectification, switching or mixing, in the Zener diode the normal rectifying characteristic of the junction is of little interest. Rather, it is the electrical breakdown in the normally blocking polarity of the junction that is most critical.

A typical Zener diode voltage-current characteristic is shown in FIG. 1. In forward bias it exhibits the usual current response typical of other diodes. In reverse bias, however, a sharp breakdown voltage point is encountered at 2, at which a large current flow begins. With classical Zener diodes the voltage breakdown is a result of tunneling, but most diodes currently described by this name actually break down by the avalanche process. Detailed information on Zener diode operation is generally available, such as in "Handbook of Semiconductor Electronics", edited by Lloyd P. Hunter, McGraw-Hill Book Company, 1970, pages 3-37-38.

A present, no practical process has been made available for fabricating a Zener-type device in a gallium arsenide substrate in a manner which is readily compatible with existing MESFET integrated circuit technology. The availability of diodes with sharp breakdown characteristics would be useful for level shifting, typically by a few volts, in MESFET circuits such as analog-to-digital converters, and potentially for providing stable reference voltages "on chip". To date level shifting in gallium arsenide integrated circuits has been accomplished by stacking up several Schottky diodes. In this type of diode a rectifying junction is formed at the interface of a deposited metal layer and a semiconductor substrate. They exhibit rectification characteristics similar to those of pn-junction diodes, but unlike pn-junction diodes they do not exhibit any minority-carrier charge-storage capacitance. When forward biased, the Schottky diodes drop about 0.7 volts each. Although this configuration approaches the desired breakdown characteristic, it is unsatisfactory because the stack has a relatively high series resistance, and also a high temperature coefficient of voltage drop.

SUMMARY OF THE INVENTION

In view of the above problems, the purpose of the present invention is to provide an integrated circuit device which has a sharp reverse breakdown characteristic comparable to a Zener diode, can be fabricated in a manner compatible with MESFET integrated circuit techniques, and avoids the high series resistance and temperature coefficient aspects of the stacked Schottky diode approach. The device should be capable of implementation in a gallium arsenide substrate, without significant surface or edge breakdown effects.

These purposes are achieved in the present invention by providing a doped buried- layer in a semi-insulating gallium arsenide substrate, together with a pair of spaced contact regions which extend from respective junctions with the buried layer to the surface of the substrate. The contact regions have a higher doping level than the buried layer but are of opposite polarity, and form spaced diode junctions with the buried layer. Two diodes are thus formed back-to-back, with the threshold voltage for conduction in either direction determined by the reverse bias breakdown voltage of one of the diodes and the forward bias voltage drop of the other diode; this approximates a Zener diode breakdown characteristic. Burying the diode junctions reduces the surface and edge breakdown effects from the levels associated with surface junctions.

In a preferred embodiment $Be^+$ ions are used to dope the buried layer p, while $Si^+$ ions are used to dope the contact regions $n^+$. The buried layer doping is performed in a two-step implantation which produces a reasonably abrupt junction with the contact regions, and also enhances conduction between the diode junctions.

In an alternate embodiment, only one contact region is of opposite polarity to the buried layer. This results in a single buried diode.

These are other features and advantages of the invention will be apparent to those skilled in the art from the following detailed description of preferred embodiments, taken together with the accompanying drawings, in which:

DETAILED DESCRIPTION OF PREFERRED EMBODIMENTS

Figure 2:
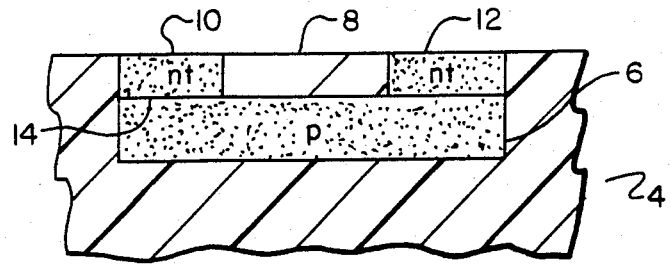
FIG. 2 is an idealized sectional view of one embodiment of the invention.

The integrated circuit structure of the present invention closely emulates the reverse bias breakdown characteristics of a Zener diode, and yet is highly compatible with present gallium arsenide MESFET fabrication processing, requiring the addition of only a single implant. A preferred embodiment is illustrated in FIG. 2. It is fabricated in a semi-insulating substrate 4, which is preferably gallium arsenide. The term "semi-insulating" generally implies a resistivity in the order of about $10^7$ ohm-cm or greater, although this is a loose definition. In this embodiment a p type buried layer 6 is formed below the upper surface 8 of the substrate. A pair of more highly doped $n+$ contact regions 10 and 12 extend in from the substrate surface above opposite ends of the buried layer 6 to establish respective junctions 14, 16 with the buried layer. These junctions of the n+ and p type materials establish diodes which produce the desired operating characteristics of the invention. Since the diode junctions are buried in the semi-insulating substrate, associated surface and edge breakdown phenomena are minimal. This configuration accordingly provides a naturally guarded diode.

Figure 3:
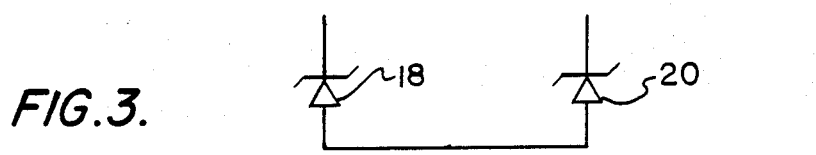
FIG. 3 is a schematic diagram of the circuit formed by the structure of FIG. 2.

FIG. 3 is a schematic diagram of the circuit formed by the structure of FIG. 2. It consists of a pair of back-to-back diodes 18 and 20 formed across junctions 14 and 16, respectively. The anodes of the diodes are connected together (via the conductive buried- layer 6), while their cathodes are available for external circuit connection via the contact regions 10 and 12. Electrically, the device emulates the function of a Zener diode under the application of a voltage of either polarity between the two n+contacts 10, 12. Specifically, if the left-hand contact region 10 is made negative with respect to the right-hand contact region 12 by the application of a voltage equal to the sum of (a) the reverse breakdown voltage of the right-hand n+p junction 16 and (b) the forward voltage drop of the left-hand n+p junction 14, the right-hand diode 20 will break down and the left-hand diode 18 will be strongly forward biased. Thus, both diodes will be in highly conductive states, with both states exhibiting very abrupt turn-on characteristics. The device thus acts like a Zener diode, with a reverse bias threshold breakdown voltage equal to the sum of the reverse bias breakdown voltage of diode 20 and the forward bias voltage drop of diode 18.

If the polarity of the applied voltage is reversed, the device will exhibit a similar reverse bias threshold breakdown voltage equal to the sum of the breakdown voltage of diode 18 and the forward bias voltage drop of diode 20. Since the two diodes 18, 20 are essentially equivalent to each other with substantially equal doping levels, the I-V characteristic will thus be symmetrical. In a typical application, only one polarity of bias will be applied to the device, and under this condition it will function like a conventional, reverse biased single Zener diode.

In a specific implementation of the invention, n+contact regions were formed by the implantation of Si+ ions into the substrate at an implant energy of about 100 KeV and a concentration of about $4.4 \times 10^{13}/cm^2$ through 400 Angstroms of $Si_3N_4$. The implant was masked using 3,500 Angstroms of Ag over 400 Angstroms of Al. The buried p type layer was formed in a two-step implantation, both employing Be+ ions. One implantation was performed at an implant energy of about 60 KeV and an ion concentration of about $6 \times 10^{12}/cm^2$. This implantation established the basic diode junctions with the n+contact regions. The other buried layer implantation was performed at an implant energy of about 170 KeV and a concentration of about $1.2 \times 10^{13}$ to form a larger, more uniform buried layer and thereby enhance its conduction. The buried layer implantations were performed through the same $Si_3N_4$ layer as the contact region implantation. An Al/Ag mask was also used for the buried layer implants, but the Ag layer thickness was increased to about 6,000 Angstroms to stop the higher energy Be implant. After the mask was removed, 2,000 Angstroms of $SiO_2$ was deposited over the $Si_3N_4$, and the implants were annealed at 800° C. for 30 minutes in forming gas. The dielectrics were then stripped with HF. Finally, Au:Ge/Ni/Au ohmic contacts were applied to the n+ regions and sintered.

The Si n+ implant had a peak concentration of approximately $4 \times 10^{18}/cm^3$ located about 900 Angstroms from the surface, while the 60 KeV Be p type implant had a peak concentration of about $3 \times 10^{17}/cm^3$ located about 1,800 Angstroms below the surface of the substrate. This produced a fairly abrupt junction between the n-type contact regions and buried p-type layer. The two Be implants are believed to have initially produced a generally saddle-shaped concentration profile which was smoothed to a more uniform profile upon annealing. Although the contact regions were implanted before the buried layer, the sequence could have been reversed.

Figure 1:
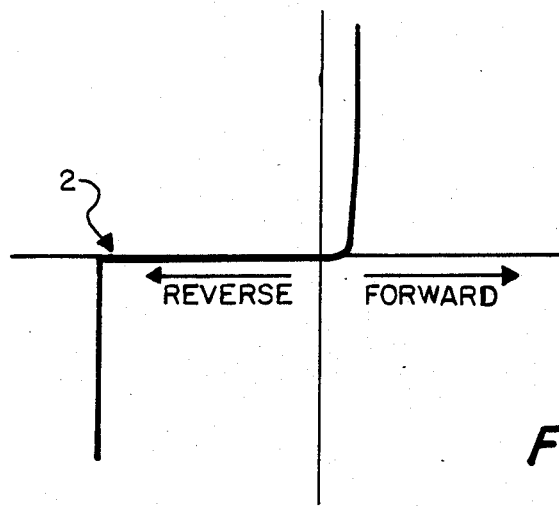
FIG. 1 is a graph of a typical Zener diode voltage-current characteristic.
Figure 4:
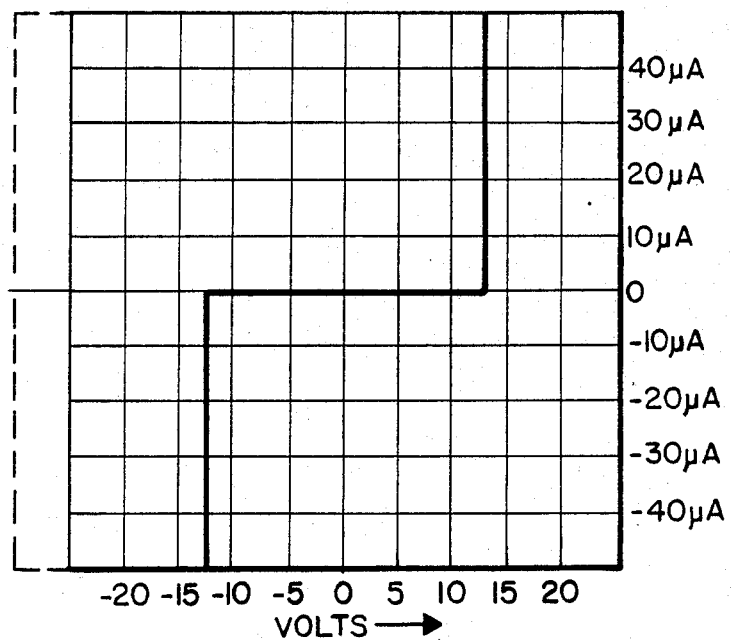
FIG. 4 is a graph of the voltage-current characteristic achieved with the structure of FIG. 2.

The current-voltage characteristic observed for the device is shown in FIG. 4. It is very symmetric, with sharp breakdowns that should be adequate for a variety of applications such as level shifting in analog-to-digital converters. In the device depicted, the area of the n+p contact was nominally 25 sq. microns (5 microns × 5 microns). Devices with contact areas up to 20 microns × 20 microns have also been fabricated. It was observed that the smaller devices gave sharper breakdowns at the same current levels. This is presumably because they must be driven harder to produce the same current, and also because larger area contacts will tend to have a broader range of breakdown voltage within the contact area than will small contacts.

Figure 5:
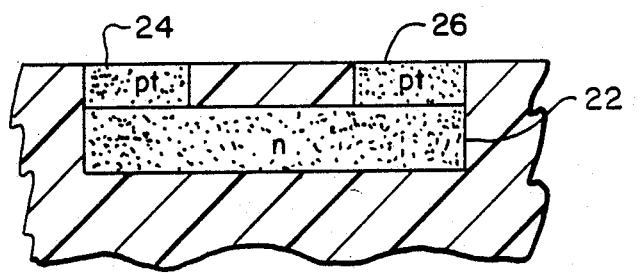
FIG. 5 is an idealized sectional view of another embodiment of the invention.
Figure 6:
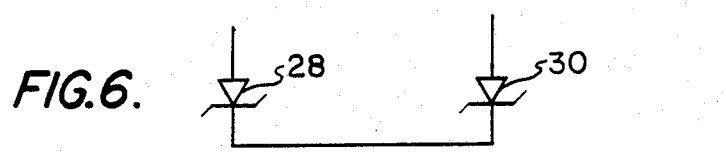
FIG. 6 is a schematic diagram of the circuit formed by the structure of FIG. 5.

The Zener emulating structure can also be formed with reversed polarities, as illustrated in FIGS. 5 and 6. In this case a buried layer 22 is formed with n type doping, while the contact regions 24, 26 have p+ dopings. The result is another pair of back-to-back diodes 28, 30 shown in FIG. 6. In this case the diode cathodes are connected in common through the buried layer, while their anodes provide contacts for connection to other devices. Since p+ contact regions are not considered to be as easy to fabricate as n+ contact regions, this embodiment is not as preferred as the previous one.

Figure 7:
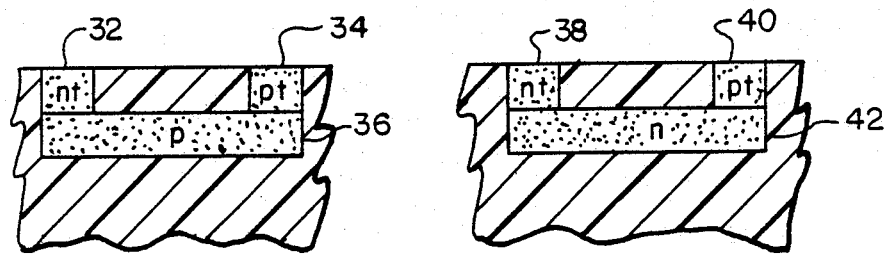
FIGS. 7(a) and 7(b) are respectively idealized sectional views of two other embodiments.
FIG. 7(c) is a schematic diagram of the circuit formed by the structure of both FIGS. 7(a) and 7(b).
Figure 7:
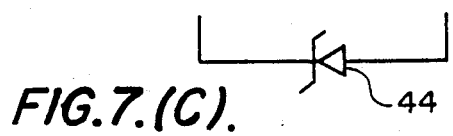

FIGS. 7(a) and 7(b) illustrate alternate embodiments in which one contact region is doped to the same polarity, and the other contact region to the opposite polarity, as the buried layer. This type of device will also have sharp breakdown characteristics because of the buried structure, but will have a different temperature coefficient of the equivalent Zener voltage. A disadvantage of this approach is that it requires extra masking and process steps to fabricate. In FIG. 7(a) an n+contact region 32 and a p+contact region 34 are provided for a p buried layer 36, while in FIG. 7(b) an n+contact region 38 and a p+contact region 40 are provided for an n buried layer 24. In either case a single equivalent Zener diode structure 44 is produced (FIG. 7(c)).

Numerous other variations and alternate embodiments will occur to those skilled in the art. Accordingly, it is intended that the invention be limited only in terms of the appended claims.

I claim:
1. A method of forming an emulated zener diode structure in a semi-insulating substrate, comprising:
 implanting dopant ions of a common polarity into the substrate through a surface thereof to form a pair of mutually spaced conductive contact regions extending from the substrate surface into its interior and mutually separated by the semi-insulating substrate material, and implanting dopant ions into the substrate through said surface to form a buried semiconductive layer of opposite polarity to said contact regions, said buried layer interfacing with said contact regions along two respective contra-directed diode junctions which are buried within the substrate and spaced by their respective contact regions from said substrate surface, whereby one of said diode junctions is reverse biased and the other is forward biased when a voltage differential is applied across said contact regions, and the effective diode breakdown voltage between said contact regions in response to said voltage differential is the sum of the reverse breakdown voltage of the reverse biased diode junction and the forward voltage drop of the forward biased diode junction.

2. The method of claim 1, wherein said substrate is formed from gallium arsenide.

3. A method of forming an emulated zener diode structure in a semi-insulating substrate, comprising:

implanting dopant ions into the substrate to form a pair of spaced conductive contact regions extending from the substrate surface into its interior, said substrate being formed from gallium arsenide, and said contact regions being formed as $n^+$ regions by implanting $Si^+$ ions into the substrate at an implant energy of about 100 KeV and a concentration of about $4.4 \times 10^{13}/cm^2$, and implanting dopant ions into the substrate to form a buried semiconductive layer of opposite polarity to at least one of the contact regions, said buried layer interfacing with said contact regions along respective diode junctions, said buried layer being formed with a p type doping by implanting $Be^+$ ions into the substrate at an implant energy of about 60 KeV and a concentration of about $6 \times 10^{12}/cm^2$.

4. The method of claim 3, wherein an additional implant of $Be^+$ ions is made into the substrate at an implant energy of about 170 KeV and a concentration of about $1.2 \times 10^{13}/cm^2$ to enhance the conduction of the buried layer.

* * * * *